US008432364B2

(12) United States Patent
Krah (10) Patent No.: US 8,432,364 B2
(45) Date of Patent: Apr. 30, 2013

(54) CHARGE RECYCLING FOR MULTI-TOUCH CONTROLLERS

(75) Inventor: Christoph Horst Krah, Los Altos, CA (US)

(73) Assignee: Apple Inc., Cupertino, CA (US)

( * ) Notice: Subject to any disclaimer, the term of this patent is extended or adjusted under 35 U.S.C. 154(b) by 1233 days.

(21) Appl. No.: 12/037,001

(22) Filed: Feb. 25, 2008

(65) Prior Publication Data
US 2009/0212642 A1 Aug. 27, 2009

(51) Int. Cl.
*G06F 3/041* (2006.01)
(52) U.S. Cl.
USPC .......................................... 345/173
(58) Field of Classification Search ............ 345/94–101, 345/173–178; 178/18.01–18.11, 20.01–20.04
See application file for complete search history.

(56) References Cited

U.S. PATENT DOCUMENTS

| | | | |
|---|---|---|---|
| 5,483,261 A | 1/1996 | Yasutake | |
| 5,488,204 A | 1/1996 | Mead et al. | |
| 5,777,596 A * | 7/1998 | Herbert | 345/104 |
| 5,825,352 A | 10/1998 | Bisset et al. | |
| 5,835,079 A | 11/1998 | Shieh | |
| 5,880,411 A | 3/1999 | Gillespie et al. | |
| 6,064,363 A | 5/2000 | Kwon | |
| 6,188,391 B1 | 2/2001 | Seely et al. | |
| 6,310,610 B1 | 10/2001 | Beaton et al. | |
| 6,323,846 B1 | 11/2001 | Westerman et al. | |
| 6,690,387 B2 | 2/2004 | Zimmerman et al. | |
| 7,015,894 B2 | 3/2006 | Morohoshi | |
| 7,184,064 B2 | 2/2007 | Zimmerman et al. | |
| 7,663,607 B2 | 2/2010 | Hotelling et al. | |
| 7,825,832 B2 * | 11/2010 | Nishimura et al. | 341/5 |
| 2005/0088395 A1 | 4/2005 | Chung | |
| 2006/0026521 A1 | 2/2006 | Hotelling et al. | |
| 2006/0097991 A1 | 5/2006 | Hotelling et al. | |
| 2006/0119596 A1 | 6/2006 | Lin | |

(Continued)

FOREIGN PATENT DOCUMENTS

| | | |
|---|---|---|
| JP | 2000-163031 A | 6/2000 |
| JP | 2002-342033 A | 11/2002 |
| WO | WO-2009/108582 A2 | 9/2009 |
| WO | WO-2009/108582 A3 | 9/2009 |

OTHER PUBLICATIONS

International Search Report mailed Apr. 16, 2010, for PCT Application No. PCT/US2009/034757, three pages.

(Continued)

*Primary Examiner* — Rodney Amadiz
(74) *Attorney, Agent, or Firm* — Morrison & Foerster LLP (57) ABSTRACT

The recycling of charge when two or more of the drive lines of a touch sensor panel are being simultaneously stimulated with the in-phase and anti-phase components of a stimulation signal is disclosed. To perform charge recycling, a discharge path can be selectively formed between drive lines being stimulated with the in-phase and anti-phase components of the stimulation signal. A multiplexer can be coupled to the driver of each drive line and the common discharge path. When charge recycling is to be performed, control logic can configure the multiplexers to isolate the driver and connect the drive lines being stimulated with the in-phase component of the stimulation signal with the drive lines being stimulated with the anti-phase component of the stimulation signal. The capacitance on the charged-up drive lines can then discharge to the capacitance on the discharged drive lines.

25 Claims, 9 Drawing Sheets

U.S. PATENT DOCUMENTS

| | | | |
|---|---|---|---|
| 2006/0197753 A1 | 9/2006 | Hotelling | |
| 2006/0227080 A1 | 10/2006 | Huang et al. | |
| 2007/0171169 A1* | 7/2007 | Hirama | 345/94 |
| 2008/0158172 A1 | 7/2008 | Hotelling et al. | |
| 2008/0303773 A1* | 12/2008 | Chen | 345/96 |
| 2008/0309625 A1 | 12/2008 | Krah et al. | |
| 2011/0242044 A1* | 10/2011 | Liu | 345/174 |
| 2011/0248955 A1* | 10/2011 | Mo et al. | 345/174 |
| 2011/0279407 A1* | 11/2011 | Kim et al. | 345/174 |
| 2012/0169661 A1* | 7/2012 | Chan et al. | 345/174 |

OTHER PUBLICATIONS

Lee, S.K. et al. (Apr. 1985). "A Multi-Touch Three Dimensional Touch-Sensitive Tablet," *Proceedings of Chi: ACM Conference on Human Factors in Computing Systems*, pp. 21-25.

Rubine, D.H. (Dec. 1991). "The Automatic Recognition of Gestures," CMU-CS-91-202, Submitted in Partial Fulfillment of the Requirements for the Degree of Doctor of Philosophy in Computer Science at Carnegie Mellon University, 285 pages.

Rubine, D.H. (May 1992). "Combining Gestures and Direct Manipulation," CHI '92, pp. 659-660.

Westerman, W. (Spring 1999). "Hand Tracking, Finger Identification, and Chordic Manipulation on a Multi-Touch Surface," A Dissertation Submitted to the Faculty of the University of Delaware in Partial Fulfillment of the Requirements for the Degree of Doctor of Philosophy in Electrical Engineering, 364 pages.

\* cited by examiner

CHARGE RECYCLING FOR MULTI-TOUCH CONTROLLERS

FIELD OF THE INVENTION

This relates to touch sensor panels that utilize multiple stimulation frequencies and phases to detect and localize touch events, and more particularly, to the recycling of charge that would otherwise be lost during the discharging of stimulated drive lines.

BACKGROUND OF THE INVENTION

Many types of input devices are presently available for performing operations in a computing system, such as buttons or keys, mice, trackballs, joysticks, touch sensor panels, touch screens and the like. Touch screens, in particular, are becoming increasingly popular because of their ease and versatility of operation as well as their declining price. Touch screens can include a touch sensor panel, which can be a clear panel with a touch-sensitive surface, and a display device that can be positioned partially or fully behind the panel so that the touch-sensitive surface can substantially cover the viewable area of the display device. Touch screens can allow a user to perform various functions by touching the touch sensor panel using a finger, stylus or other object at a location dictated by a user interface (UI) being displayed by the display device. In general, touch screens can recognize a touch event and the position of the touch event on the touch sensor panel, and the computing system can then interpret the touch event in accordance with the display appearing at the time of the touch event, and thereafter can perform one or more actions based on the touch event.

Touch sensor panels can be formed from a matrix of drive and sense lines, with sensors or pixels present where the drive and sense lines cross over each other while being separated by a dielectric material to form a capacitive sensing node. In order to scan a touch sensor panel and compute an image of touch, various phases of selected frequencies can be used to simultaneously stimulate the drive lines of the touch sensor panel, and one or more mixers can be configured to demodulate the signals received from the sense lines using the selected frequencies. The demodulated signals from the mixers can be used in calculations to determine an image of touch for the touch sensor panel at each frequency.

A concern with touch devices is the amount of power they consume when scanning the touch sensor panel. The high power consumption problem can be particularly important for hand-held or battery powered devices, as part of the power consumed by device can be due to repeated charging of the stray capacitances of the drive electrodes in the multi-touch panel.

SUMMARY OF THE INVENTION

This relates to the recycling of charge when two or more of the drive lines of a touch sensor panel are being simultaneously stimulated with the in-phase and anti-phase components of a stimulation signal. By discharging the capacitance of a drive line being stimulated with the in-phase component of a stimulation signal into the capacitance of another drive line being stimulated with the anti-phase component of that same stimulation signal, charge can be recycled.

To perform charge recycling, a discharge path (charge recycling path) can be selectively formed between drive lines being stimulated with the in-phase and anti-phase components of the stimulation signal. A multiplexer can be coupled to the driver of each drive line and the common discharge path. When charge recycling is to be performed, control logic can configure the multiplexers to isolate the driver and couple the drive lines being stimulated with the in-phase component of the stimulation signal with the drive lines being stimulated with the anti-phase component of the stimulation signal. The capacitance on the charged-up drive lines can then discharge to the capacitance on the discharged drive lines. In some embodiments, the multiplexers can be modulated with a pulse width modulated (PWM) signal during the charge recovery stage. This can provide control over the waveshape of the discharge waveform to reduce EMI and maximize the signal recovered.

When an equilibrium point is reached, the discharge path can be disconnected, and the drivers can be re-connected to their respective drive lines. By configuring the drivers to their appropriate states, the capacitance on the initially charged-up drive lines can be fully discharged through their respective drivers, while the capacitance on the initially discharged drive lines can be fully charged through their respective drivers. In some embodiments, instead of fully discharging the capacitance through the drivers, the control logic can configure the drivers such that the capacitance is discharged to a holding capacitor instead of to ground. Holding capacitor can be utilized by a charge pump and applied to a power supply voltage to generate a higher supply voltage than the power supply itself, so that the power supply need not produce the full supply voltage required by the touch sensor panel.

DETAILED DESCRIPTION OF THE PREFERRED EMBODIMENTS

In the following description of preferred embodiments, reference is made to the accompanying drawings which form a part hereof, and in which it is shown by way of illustration specific embodiments in which the invention can be practiced. It is to be understood that other embodiments can be used and structural changes can be made without departing from the scope of the embodiments of this invention.

This relates to the recycling of charge when two or more of the drive lines of a touch sensor panel are being simultaneously stimulated with the in-phase and anti-phase components of a stimulation signal. By discharging the capacitance of a drive line being stimulated with the in-phase component of a stimulation signal into the capacitance of another drive line being stimulated with the anti-phase component of that same stimulation signal, charge is recycled.

Although some embodiments of this invention may be described herein in terms of mutual capacitance touch sensors, it should be understood that embodiments of this invention are not so limited, but are generally applicable to other types of touch sensors such as self capacitance touch sensors. Furthermore, although the touch sensors in the touch sensor panel may be described and illustrated herein in terms of an orthogonal array of touch sensors having drive and sense lines, it should be understood that embodiments of this invention are not limited to orthogonal arrays, but can be generally applicable to touch sensors arranged in any number of dimensions and orientations, including diagonal, concentric circle, and three-dimensional and random orientations. In addition, the touch sensor panel described herein can be either a single-touch or a multi-touch sensor panel, the latter of which is described in Applicant's co-pending U.S. application Ser. No. 11/649,998 entitled "Proximity and Multi-Touch Sensor Detection and Demodulation," filed on Jan. 3, 2007, the contents of which are incorporated herein by reference in its entirety for all purposes.

When scanning a touch sensor panel to obtain an image of touch, at each of multiple steps, various phases of selected frequencies can be used to simultaneously stimulate the drive lines of the touch sensor panel. For example, one drive line may be stimulated by the in-phase version of a particular stimulation frequency, while at the same time another drive line may be stimulated by the "anti-phase" version of the same stimulation frequency. Multiple mixers in each sense channel can be configured to demodulate the signal received from the sense line coupled to each sense channel using the selected frequencies. The demodulated signals from the multiple mixers can then be saved. After all steps have been completed, the saved results can be used in calculations to determine an image of touch for the touch sensor panel at each frequency. A more detailed description of a touch sensor panel and associated sense circuitry for using multiple stimulation frequencies and phases to detect touch events is described in U.S. application Ser. No. 11/818,345 filed on Jun. 13, 2007 and entitled "Multiple Simultaneous Frequency Detection," the contents of which are incorporated herein by reference in its entirety for all purposes.

Embodiments of the invention are directed to recycling of charge (energy) stored in the stray capacitance Cstray of the pixels in a capacitive touch sensor panel. In a mutual capacitance touch sensor panel, multiple drive lines can be simultaneously stimulated with a periodic signal that can vary from about zero volts to about 5.4V, for example. These stimulation signals can result in Cstray being repeatedly charged and discharged. The energy stored in a capacitor can be represented as $\frac{1}{2}CV^2$, where C is the capacitance of the capacitor and V is the voltage across the capacitor. In conventional touch sensor panel designs, the discharging of Cstray to about zero volts represents a waste of stored charge. However, by recycling the charge, power is saved, which can increase battery life.

Figure 1:
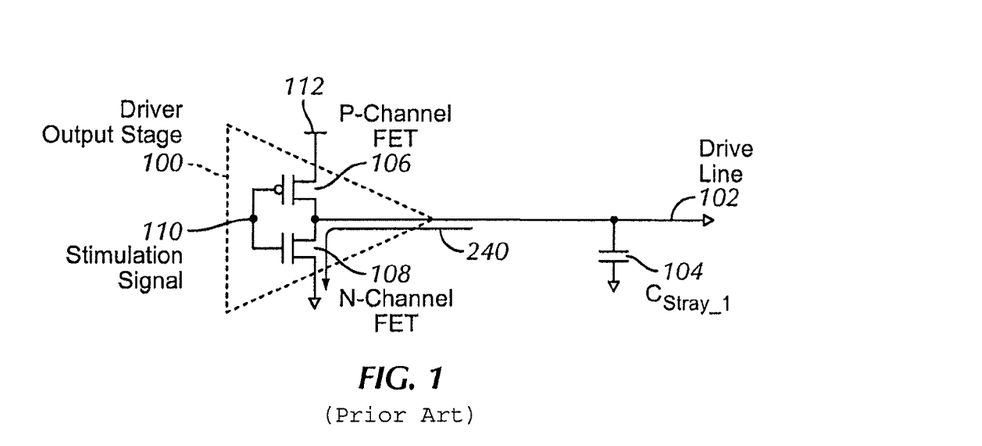
FIG. 1 illustrates a conventional driver output stage driving a drive line in a touch sensor panel having a stray capacitance.

FIG. 1 illustrates conventional driver output stage 100 driving drive line 102 having stray capacitance Cstray_1 104. Driver output stage 100 can include a p-channel field effect transistor (FET) 106 and an n-channel FET 108 in a well-known configuration (although it should be understood that other output stage designs with other types of transistors can also be employed). Stimulation signal 110 can cause FETs 106 and 108 to alternate between off and on states, with FETs 106 and 108 always being in opposing states (except during momentary transitional states). When stimulation signal 110 is low, FET 106 is turned on, FET 108 is turned off, and Cstray_1 104 is charged by supply voltage 112 (which can be approximately equal to the stimulation signal Vstm) through FET 106. When stimulation signal 110 is high, FET 106 is turned off, FET 108 is turned on, and Cstray_1 104 is discharged to ground through FET 108 and discharge path 240. The charge on Cstray_1 104 that is discharged to ground through discharge path 240 represents an inefficiency and a waste of stored charge.

Figure 2A:
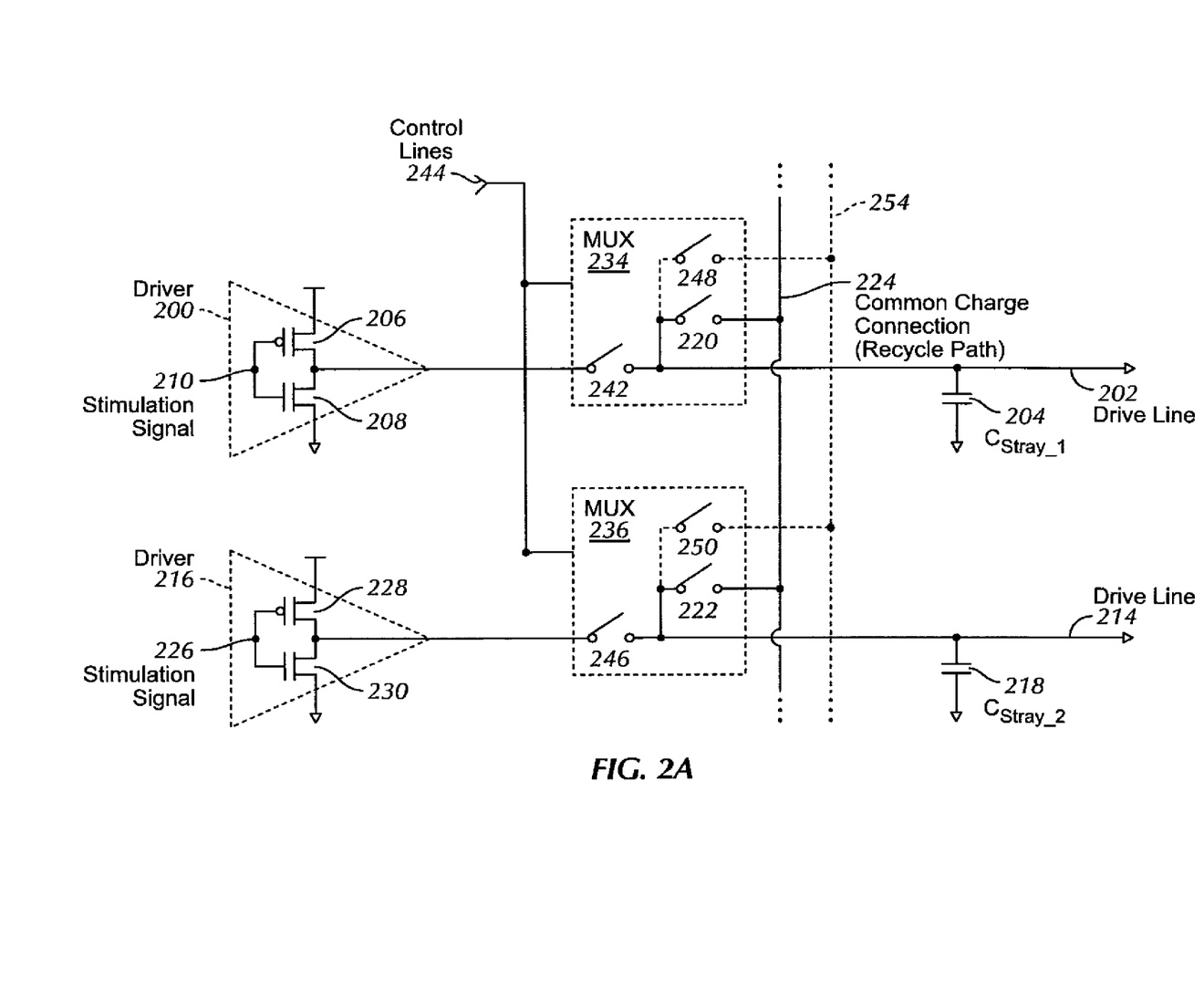
FIG. 2a illustrates the exemplary recycling of charge between drive lines of a touch sensor panel according to one embodiment of this invention.

FIG. 2a illustrates the exemplary recycling of charge stored on Cstray according to embodiments of the invention. In FIG. 2a, drive lines 202 and 214 having stray capacitances Cstray_1 204 and Cstray_2 218 are driven by driver output stages 200 and 216, respectively. FETs 206 and 208 within output stage 200 are controllable by stimulation signal 210, and FETs 228 and 230 in output stage 216 are controllable by stimulation signal 226. Cstray_1 204 and Cstray_2 218 can be coupled to either output stages 200 and 216, respectively, or to common charge connection (charge recycle path) 224, via multiplexers 234 and 236, respectively. Multiplexer 234 can include charge recycling switch 220 and driver switch 242 controllable by one or more control lines 244. Multiplexer 236 can include charge recycling switch 222 and driver switch 246 controllable by one or more control lines 244. These multiplexers can be located in the same logic board or ASIC as the drivers, or alternatively, can be located on the touch sensor panel itself. Note that the switches within multiplexers 234 and 236 can be transistor switches such as transmission gates that allow current to flow through them with minimal on-state resistance when closed. In the example of FIG. 2a, drive lines 202 and 214 are always stimulated with the opposite phases of the same stimulation signal. In other words, when drive line 202 is charged (or being charged), drive line 214 is discharged (or being discharged), and vice versa.

Cstray_1 204 on drive line 202 can be charged up by setting stimulation signal 210 to a low state, which turns FET 206 on and turns FET 208 off. With switch 220 open and switch 242 closed, Cstray_1 204 can be charged by the power supply through FET 206. Cstray_2 218 on drive line 214 can be discharged by setting stimulation signal 226 to a high state, which turns FET 228 off and turns FET 230 on. With switch 222 open and switch 246 closed, Cstray_2 218 can be discharged to ground through FET 230.

When the stimulation signals 210 and 226 transition to their opposite states, charge recycling can occur. To recycle charge between drive lines 202 and 214 according to embodiments of the invention, prior to the transitioning of stimulation signals 210 and 226, switches 242 and 246 can be opened, effectively disconnecting Cstray_1 204 and Cstray_2 218 from drivers 200 and 216. After switches 242 and 246 are opened, stimulation signal 210 can be set to a high state, which turns FET 206 off and turns FET 208 on. Stimulation signal 226 can be set to a low state, which turns FET 228 on and turns FET 230 off. Switches 220 and 222 can be closed, so that there is a path from Cstray_1 204 to Cstray_2 218 through the switches. As a result, Cstray_1 204 discharges while Cstray_1 218 charges, recycling charge. Eventually, Cstray_1 204 and Cstray_2 218 can reach an equilibrium point, at approximately the same voltage V_CM.

After Cstray_1 204 and Cstray_2 218 have reached or at least approached a partially discharged/partially charged equilibrium point, switches 220 and 222 can be opened, and switches 242 and 246 can be closed to "fully" discharge and full charge Cstray_1 204 and Cstray_2 218 (although it should be noted that the capacitances may never become completely discharged or completely charged). Because FET 208 is on, Cstray_1 204 can continue to discharge to ground through FET 208. Meanwhile, because FET 228 is on, Cstray_2 218 can continue to charge through FET 228 to the supply voltage. Once Cstray_1 204 has discharged and Cstray_2 218 has charged, drive lines 202 and 214 have effectively changed state.

It should be understood that although in the example of FIG. 2a, the recycling of charge occurs between two adjacent drive lines, in practice the recycling of charge can occur between any two or more drive lines being driven with the opposite phases of the same stimulation signal. In addition, because the stimulation patterns for driving the drive lines can vary from frame to frame, a number of charge recycling switch configurations can employed in parallel so that for any particular pattern and frame, all drive lines being driven by opposite phases of the same stimulation signal can be coupled together to enable charge recycling between them. To implement these additional switch configurations, one or more additional switches 248 and 250 can be included in multiplexers 234 and 236 to couple to one or more additional charge recycling paths 254.

Figure 2B:
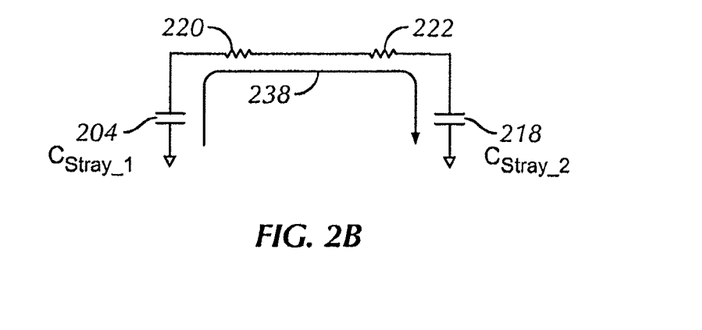
FIG. 2b illustrates an exemplary equivalent circuit model of the charge recycling between drive lines of a touch sensor panel according to one embodiment of this invention.

FIG. 2b illustrates an exemplary equivalent circuit model of the charge recycling between Cstray_1 204 and Cstray_2 218 according to embodiments of the invention. In the example of FIG. 2b, charge recycling switches 220 and 222 can be represented by resistors having a resistance of $R_{DS\_ON}$, which is the drain to source channel resistance of the switch at a particular gate-source voltage. As current 238 flows from Cstray_1 204 to Cstray_2 218, power is dissipated through resistances 220 and 222, which is lost as thermal energy. As mentioned above, during the initial charge recycling, Cstray_1 204 does not discharge completely to ground, and Cstray_2 218 does not charge completely to VSTM.

The initial energy stored in capacitors Cstray_1 204 and Cstray_2 218 is:

$$E\text{start} = \tfrac{1}{2} C_{stray\_1} V_{STM}^2, \tag{1}$$

wherein Vstm is the stimulus voltage level. The energy due to Cstray_2 218 is zero because it discharged to ground. In the charge recycling step, the voltages across Cstray_1 204 and Cstray_2 218 reach an equilibrium point at a voltage Vresidual, respectively, so that the respective capacitors store the following energies:

$$E1 = \tfrac{1}{2} C_{stray\_1} V_{residual}^2, \text{ and} \tag{2}$$

$$E2 = \tfrac{1}{2} C_{stray\_2} V_{residual}^2. \tag{3}$$

The total energies need to be conserved such that;

$$E\text{start} - (E1 + E2 + \Delta E\text{loss}) = 0, \tag{4}$$

wherein ΔEloss is the energy converted to thermal energy through resistances 220 and 222 that is lost from the system as usable energy. Because the energy on Cstray_1 204 is lost in the discharge cycle, half of the initial energy Estart is lost during the subsequent discharge cycle. By recycling the charge from E1, the efficiency of the charge recycling mechanism is:

$$N_{EFF\_CR} = (E1 + \Delta E\text{loss})/E\text{start}.$$

Assuming Cstray_1 204 equals Cstray_2 218, and thus E1=E2 and E1=Estart/2−Eloss, the following is obtained:

$$N_{EFF\_CR} = (E\text{start}/2 - \Delta E\text{loss})/E\text{start}. \tag{5}$$

Setting ΔEloss=0 would yield a charge recovery efficiency of 50%. However, with a finite ΔEloss, the charge recovery efficiency drops below 50%.

Figure 3:
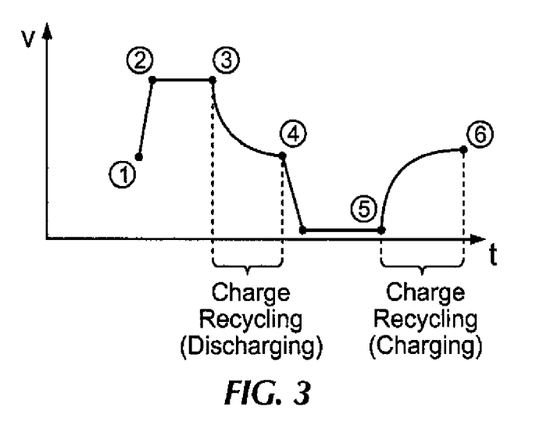
FIG. 3 illustrates an exemplary voltage plot versus time for the voltage seen on a drive line during charging and charge recycling according to one embodiment of this invention.

FIG. 3 illustrates an exemplary voltage plot versus time for the voltage seen at Cstray_1 204 of FIG. 2a during charging and charge recycling according to embodiments of the invention. Note that at point (1), p-channel FET 206 is on, n-channel FET 208 is off, switch 242 is closed and switch 220 is open, and thus Cstray_1 204 charges through the p-channel FET until it is charged at point (2). At point (3), switch 242 is open and charge recycling switch 220 is closed, and Cstray_1 204 discharges through charge recycling path 224 until point (4) is reached, where equilibrium (or near equilibrium) is reached. At that time, switch 220 can be opened and switch 242 can be closed, at which time Cstray_1 204 can continue to discharge to ground through FET 230 (which is now on) until point (5) is reached, where Cstray_1 is discharged. At point (6), a new charge recycling period can be started, where Cstray_1 204 can be charged back up to equilibrium point (1).

Figure 4A:
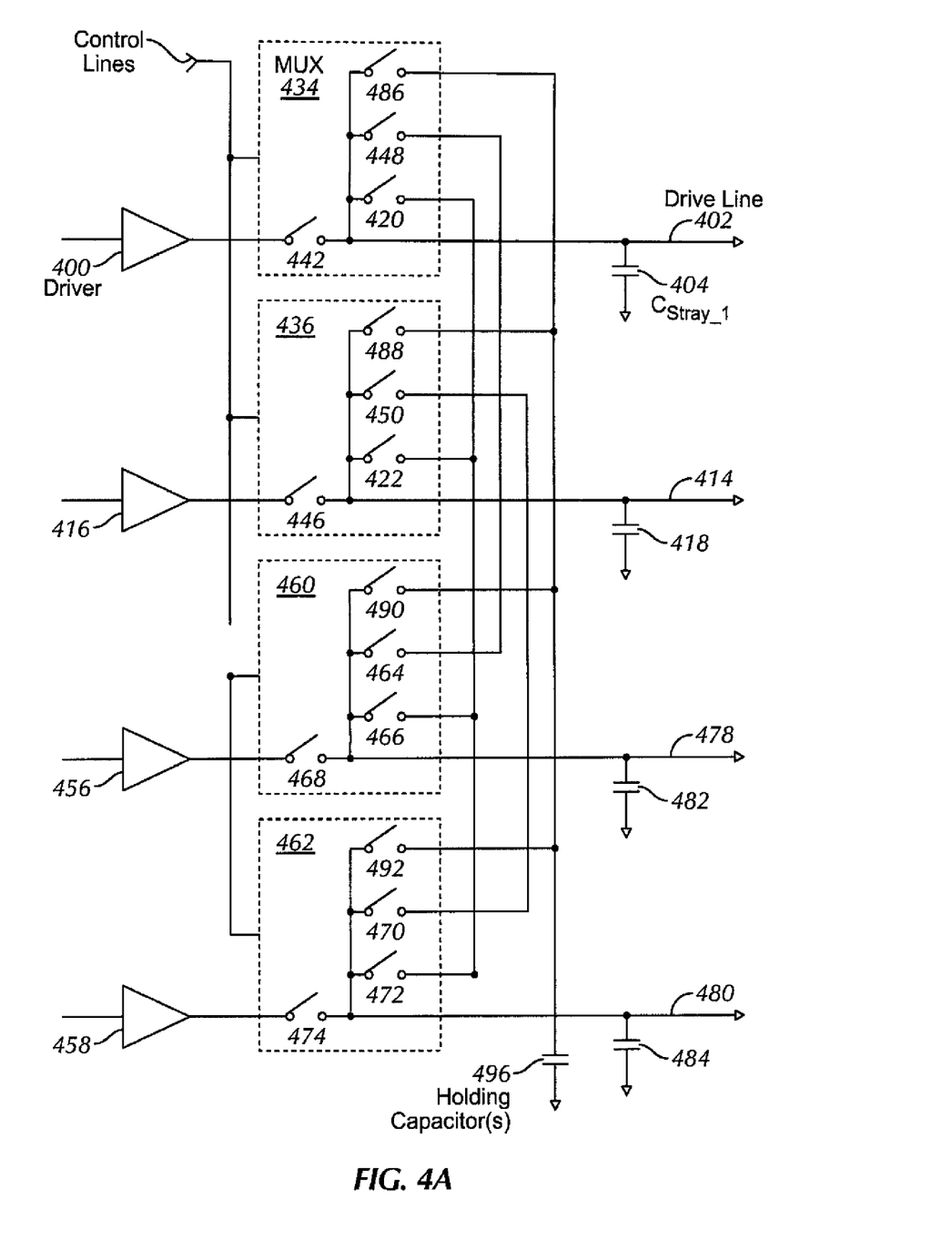
FIG. 4a illustrates an exemplary four drive line embodiment employing the recycling of charge according to one embodiment of this invention.

FIG. 4a illustrates an exemplary four drive line embodiment employing the recycling of charge according to embodiments of the invention. In the example of FIG. 4, in one frame, drive lines 402 and 414 are driven with the same phase of the same stimulation signal, while drive lines 478 and 480 are driven with the opposite phase of the same stimulation signal. Charge recycling during this frame can be enabled by opening switches 442, 446, 468 and 474, opening switches 448, 450, 464 and 470, and closing switches 420, 422, 466 and 472, which allows the stray capacitances 404, 428, 482 and 484 to discharge (or charge) as appropriate through charge recycling bus (A) until an equilibrium point is reached between them.

However, in another frame, drive lines 402 and 478 can be driven with opposite phases of a stimulation signal, while drive lines 414 and 480 can be driven with opposite phases of a different stimulation signal. Charge recycling during this frame can be enabled by opening switches 442, 446, 468 and 474, opening switches 420, 422, 466 and 472, and closing switches 448, 450, 464 and 470. This configuration allows stray capacitances 404 and 482 to discharge (or charge) as appropriate until and equilibrium point is reached between them, and also allows stray capacitances 418 and 484 to discharge (or charge) as appropriate through charge recycling bus (B) until an equilibrium point is reached between them.

In yet another frame, all rows can be driven with the same stimulation signal (i.e. same frequency and phase), as can be the case in a so-called "auto-scan" mode, where the touch panel can be scanned in a low-power state to detect touch events (but not their location). Charge recycling during this frame can be enabled by opening switches 442, 446, 468 and 474, opening switches 420, 422, 466 and 472, opening switches 448, 450, 464 and 470, and closing switches 486, 488, 490 and 492. This configuration allows stray capacitances 404, 418, 482 and 484 to partially discharge into one or more holding capacitors 496 through charge recycling bus (C). The number of holding capacitors 496 and the total capacitance of the holding capacitors can be chosen in accordance with the total capacitance of stray capacitances 404, 418, 482 and 484 so that after the stray capacitances partially discharge into the holding capacitors, a desired equilibrium voltage is reached. After this equilibrium point is reached, by opening switches 486, 488, 490 and 492 and closing switches 442, 446, 468 and 474, stray capacitances 404, 418, 482 and 484 can be fully discharged to ground.

The stored charge in holding capacitor 496 can then be recovered during the next transition of drive lines 402, 414, 478 and 480 from ground to a residual (equilibrium) voltage level by coupling the holding capacitor to the drive lines. This can be accomplished by opening switches 442, 446, 468 and 474 and closing switches 486, 488, 490 and 492. After an equilibrium point is reached, switches 486, 488, 490 and 492 can be opened and switches 442, 446, 468 and 474 can be closed, and the charging of stray capacitances 404, 418, 482 and 484 can be completed by configuring drivers 400, 416, 456 and 458 to output a high state so that the stray capacitances can completely charge to the supply voltage through the drivers. Note that the use of holding capacitor 496 to save and recover charge, although described above in the context of auto-scan mode, can also be used as an alternative to directly coupling and simultaneously charging and discharging drive lines being stimulated with opposite phases of the same stimulation signal.

As the above examples indicate, the charge recycling process can utilize multiple charge recycling buses depending on which scanning mode is used. As described above, in various panel scan modes, different drive lines can be stimulated with the in-phase and anti-phase components of the same stimulation frequency in different frames. In other words, different "stimulation patterns" can be applied during different frames, each stimulation pattern potentially requiring a different charge recycling bus. In auto-scan mode, all drive lines can be driven by the same stimulation signal, and this auto-scan stimulation pattern can also require a different charge recycling bus. A processor or dedicated logic can therefore be employed to control the stimulation patterns and multiplexers 434, 436, 460 and 462 to couple different drive lines to different charge recycling buses and/or holding capacitors in advance of the next stimulation pattern.

In another embodiment of the invention, switches 420, 422, 466, and 472 can be modulated with a pulse width modulated (PWM) signal during the charge recovery stage. This can provide control over the waveshape of the discharge waveform (similar to what is done in a Class D amplifier). For example, if the characteristic of the discharge waveform from point (3) to point (4) in FIG. 3a is exponential, the DC component of the PWM signal can be chosen to have a logarithmic response to provide a more linear response in that particular portion of the discharge waveform. An advantage of using this scheme is controlling the harmonic content of the discharge waveform to reduce EMI and maximize the signal recovered.

Figure 4B:
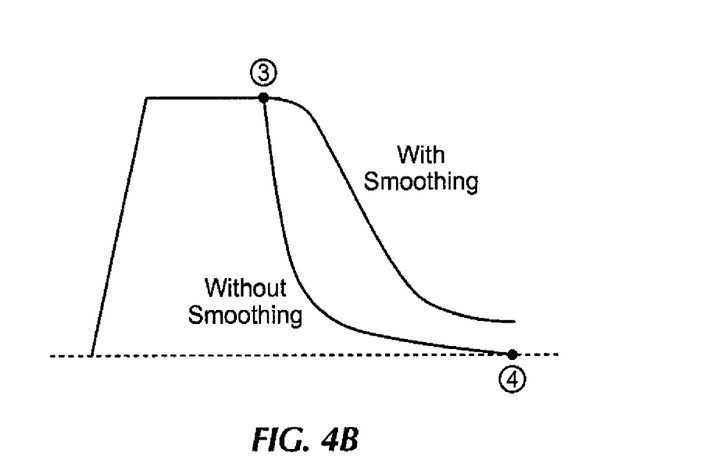
FIG. 4b illustrates an exemplary effect of smoothing between points (3) and (4) in FIG. 3a according to one embodiments of this invention.

FIG. 4b shows an exemplary effect of smoothing between points (3) and (4) in FIG. 3a according to embodiments of the invention. The same concept can also be used to smooth the waveform during the charge and discharge cycles to reduce the content of high frequency harmonics introduced during the transition phases at points (1) to (6) in FIG. 3a.

Figure 4C:
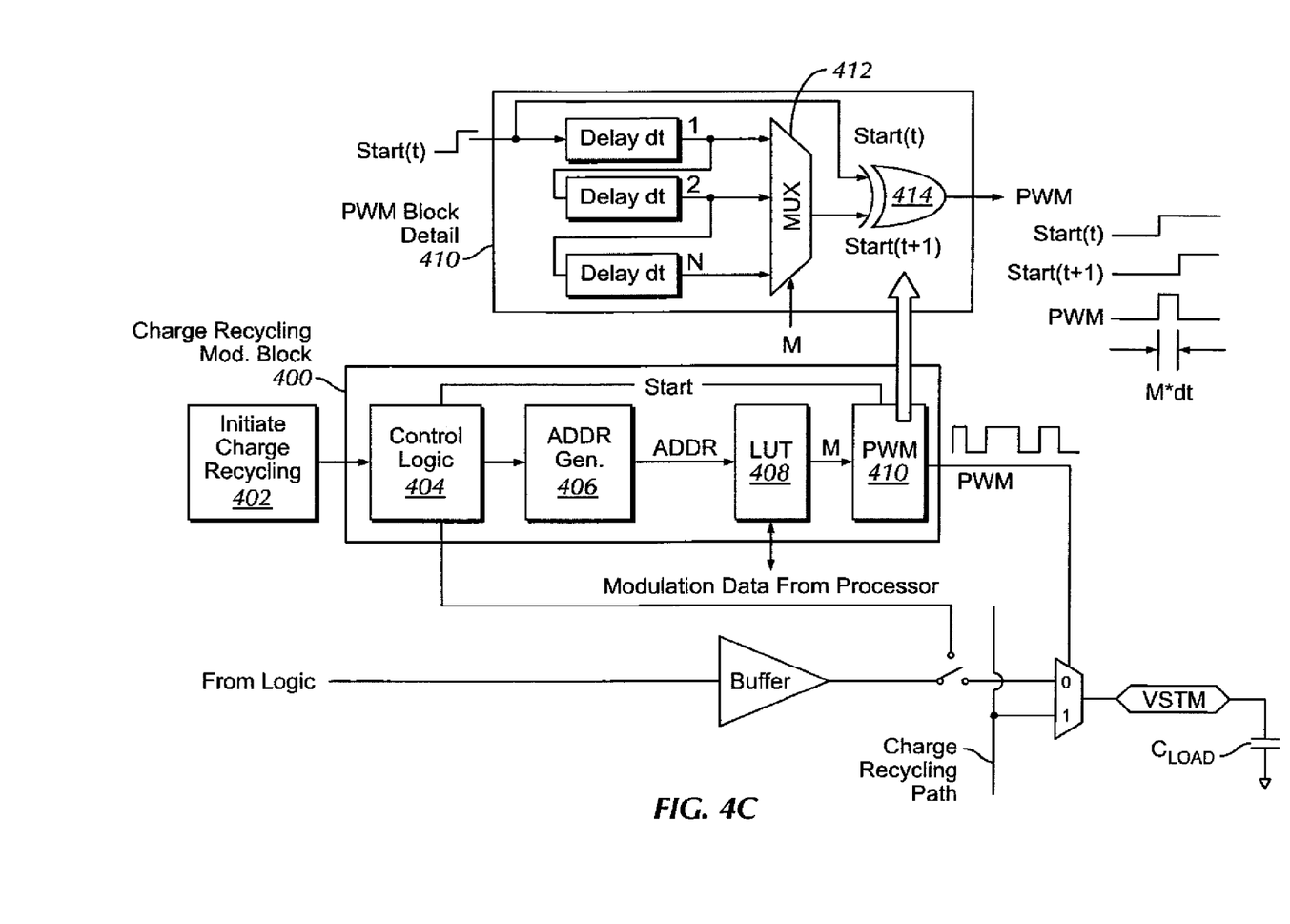
FIG. 4c illustrates an exemplary charge recycling modulation block according to embodiments of the invention.

FIG. 4c shows an exemplary charge recycling modulation block 400 according to embodiments of the invention. Upon receiving "initiate charge recycling" signal 402 when reaching point (3) in FIG. 3a, control logic 404 can enable address generator 406. In one example, there may be eight PWM steps between point (3) and (4) in FIG. 3a. Assuming a transition time of about one microsecond between points (3) and (4), this translates into a step period of about 125 ns (an 8 MHz clock) with a programmable PWM value for each step. As address generator 406 is incremented, a new PWM value is retrieved from lookup table (LUT) 408 and sent to PWM block 410. In one embodiment, PWM block 410 can be implemented as shown using daisy-chained delay elements 1 to N. Multiplexer 412 can select a delay tap. A transition (with reference to signal START(t)) can be delayed by M delay elements, yielding a delay of M*dt and a pulse at the output of XOR gate 414 of the same duration. Delays of sub nanosecond levels are possible, yielding a resolution of greater than 125 levels per step.

Figure 5A:
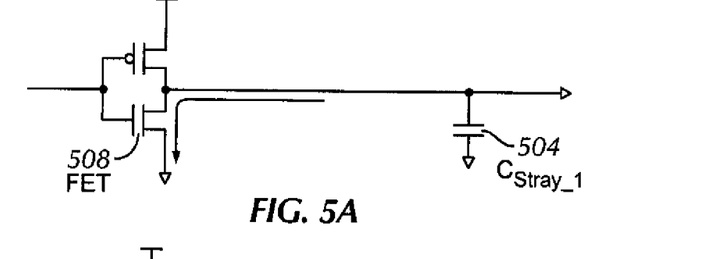
FIG. 5a illustrates a stray capacitance on a drive line discharging through an n-channel FET to ground to complete the discharging of the stray capacitance in a conventional state transition.

FIG. 5a illustrates Cstray_1 504 discharging through n-channel FET 508 to complete the discharging of Cstray_1 as discussed above. Fully discharging stray capacitance to ground through the driver can occur for any of the stimulation modes and patterns (panel scan, auto-scan) discussed with regard to FIG. 4a. However, the discharging of stray capacitance to ground also represents wasted charge.

Figure 5B:
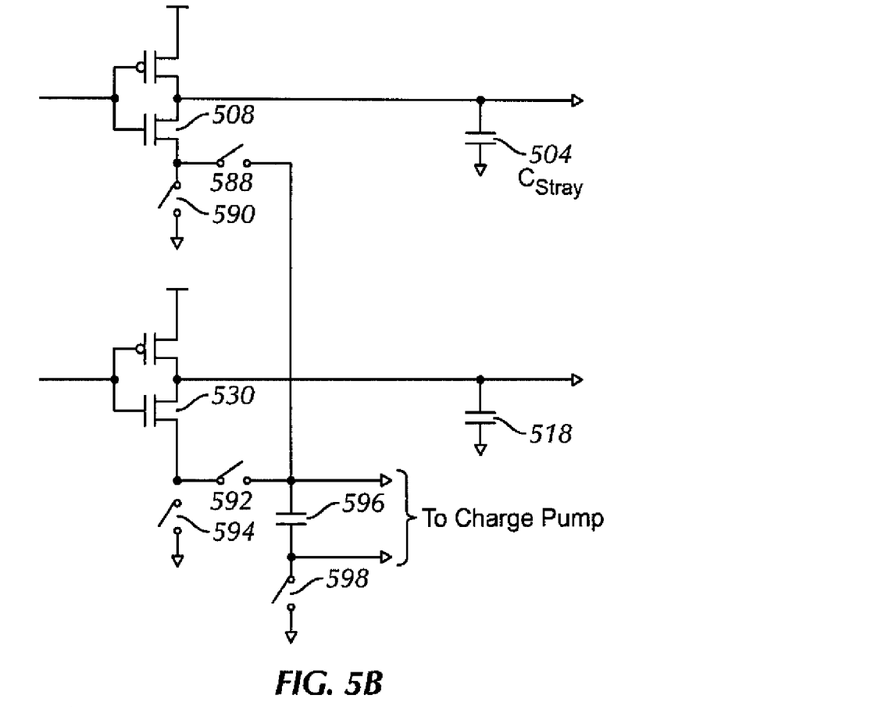
FIG. 5b illustrates exemplary advanced charge recycling according to one embodiment of this invention.

FIG. 5b shows exemplary advanced charge recycling according to embodiments of the invention. In the example of FIG. 5a, both Cstray_1 504 and Cstray_2 518 are being discharged, either as part of a panel scan stimulation pattern or an auto-scan stimulation pattern. To recycle the charge, ground switches 590 and 594 can be opened and charge recycling switches 588, 592 and 598 can be closed to divert the charge to holding capacitor 596. Holding capacitor 596 can be a different capacitor or the same capacitor as the holding capacitor 496 of FIG. 4a. When a certain threshold voltage across capacitor 596 is reached, switches 588, 592 and 598 can be opened, and holding capacitor 596 can be utilized by a charge pump and applied to a power supply voltage to generate a higher supply voltage than the power supply itself, so that the power supply need not produce the full supply voltage required by the touch sensor panel.

Figure 5C:
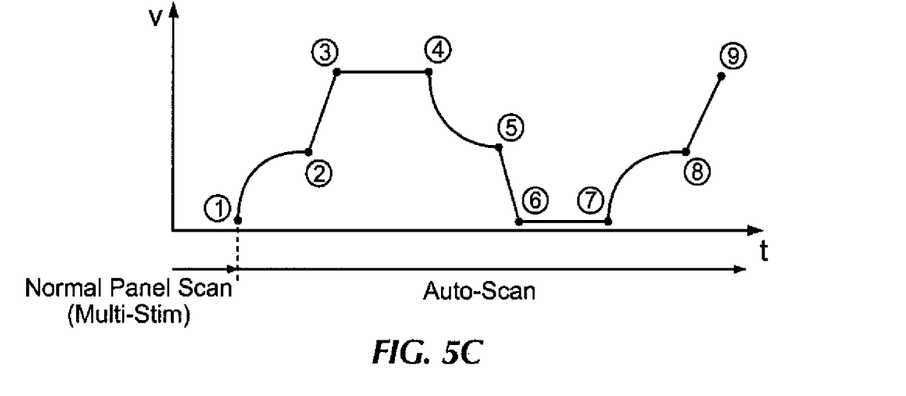
FIG. 5c illustrates an exemplary voltage plot versus time for the voltage seen on one or more drive lines during charging and charge recycling while switching between a normal panel scan to an auto-scan mode according to one embodiment of this invention.

FIG. 5c illustrates an exemplary voltage plot versus time for the voltage seen on one or more drive lines during charging and charge recycling while switching between a normal panel scan to an auto-scan mode according to embodiments of the invention. In the example of FIG. 5c, prior to point (1), normal panel scan was occurring and the one or more drive lines had become fully discharged. At point (2), the touch sensor panel was switched over to auto-scan mode. Between point (1) and (2), a first charge recycling path can be used to recover charge from the one or more previously charged drive lines. Between points (2) and (3), the one or more drive lines can be charged up to the supply voltage through drivers coupled to the drive lines. Between points (4) and (5), a second charge recycling path can be used to dump charge from the one or more drive lines into a holding capacitor until an equilibrium point is reached. Between points (5) and (6), the drive lines can be fully discharged to ground through the coupled drivers. Between points (7) and (8), the second charge recycling path can be used to couple the holding capacitor to the drive lines so that the drive lines can be charged up to an equilibrium point. Between points (8) and (9), the drive lines can be fully charged to the supply voltage through the coupled drivers.

Figure 6:
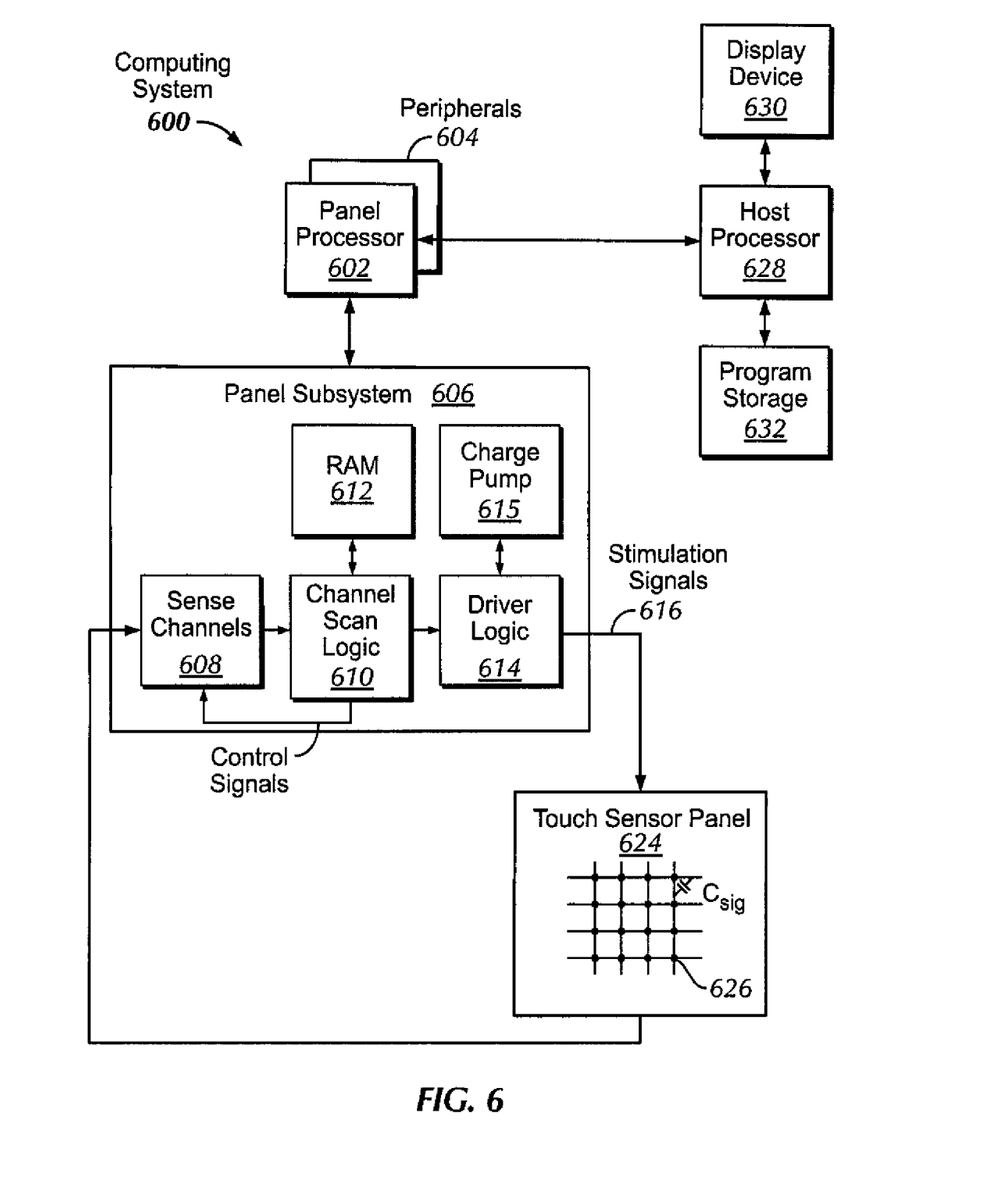
FIG. 6 illustrates exemplary a computing system that can include charge recycling according to one embodiment of this invention.

FIG. 6 illustrates exemplary computing system 600 that can include one or more of the embodiments of the invention described above. Computing system 600 can include one or more panel processors 602 and peripherals 604, and panel subsystem 606. Peripherals 604 can include, but are not limited to, random access memory (RAM) or other types of memory or storage, watchdog timers and the like. Panel subsystem 606 can include, but is not limited to, one or more sense channels 608, channel scan logic 610 and driver logic 614. Channel scan logic 610 can access RAM 612, autonomously read data from the sense channels and provide control for the sense channels. In addition, channel scan logic 610 can control driver logic 614 to generate stimulation signals 616 at various frequencies and phases that can be selectively applied to drive lines of touch sensor panel 624. In some embodiments, panel subsystem 606, panel processor 602 and peripherals 604 can be integrated into a single application specific integrated circuit (ASIC).

Touch sensor panel 624 can include a capacitive sensing medium having a plurality of drive lines and a plurality of sense lines, although other sensing media can also be used. Each intersection of drive and sense lines can represent a capacitive sensing node and can be viewed as picture element (pixel) 626, which can be particularly useful when touch sensor panel 624 is viewed as capturing an "image" of touch. (In other words, after panel subsystem 606 has determined whether a touch event has been detected at each touch sensor in the touch sensor panel, the pattern of touch sensors in the multi-touch panel at which a touch event occurred can be viewed as an "image" of touch (e.g. a pattern of fingers touching the panel).) Each sense line of touch sensor panel 624 can drive sense channel 608 (also referred to herein as an event detection and demodulation circuit) in panel subsystem 606.

Computing system 600 can also include host processor 628 for receiving outputs from panel processor 602 and performing actions based on the outputs that can include, but are not limited to, moving an object such as a cursor or pointer, scrolling or panning, adjusting control settings, opening a file or document, viewing a menu, making a selection, executing instructions, operating a peripheral device coupled to the host device, answering a telephone call, placing a telephone call, terminating a telephone call, changing the volume or audio settings, storing information related to telephone communications such as addresses, frequently dialed numbers, received calls, missed calls, logging onto a computer or a computer network, permitting authorized individuals access to restricted areas of the computer or computer network, loading a user profile associated with a user's preferred arrangement of the computer desktop, permitting access to web content, launching a particular program, encrypting or decoding a message, and/or the like. Host processor 628 can also perform additional functions that may not be related to panel processing, and can be coupled to program storage 632 and display device 630 such as an LCD display for providing a UI to a user of the device.

Note that one or more of the functions described above can be performed by firmware stored in memory (e.g. one of the peripherals 604 in FIG. 6) and executed by panel processor 602, or stored in program storage 632 and executed by host processor 628. The firmware can also be stored and transported within any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any medium that can contain, store, communicate, propagate, or transport the program for use by or in connection with the instruction execution system, apparatus, or device. The computer readable medium can include, but is not limited to, an electronic, magnetic, optical, electromagnetic, infrared, or semiconductor system, apparatus, device, or propagation medium. A computer-readable medium can include, but is not limited to, an electrical connection (electronic) having one or more wires, a portable computer diskette (magnetic), a random access memory (RAM) (magnetic), a read-only memory (ROM) (magnetic), an erasable programmable read-only memory (EPROM) (magnetic), an optical fiber (optical), portable optical disc such a CD, CD-R, CD-RW, DVD, DVD-R, or DVD-RW, or flash memory such as compact flash cards, secured digital cards, USB memory devices, memory sticks, and the like. Note that the computer-readable medium could even be paper or another suitable medium upon which the program is printed, as the program text can be electronically captured via optical scanning of the paper or other medium, then compiled, interpreted or otherwise processed in a suitable manner if necessary, and then stored in a computer memory.

Figure 7:
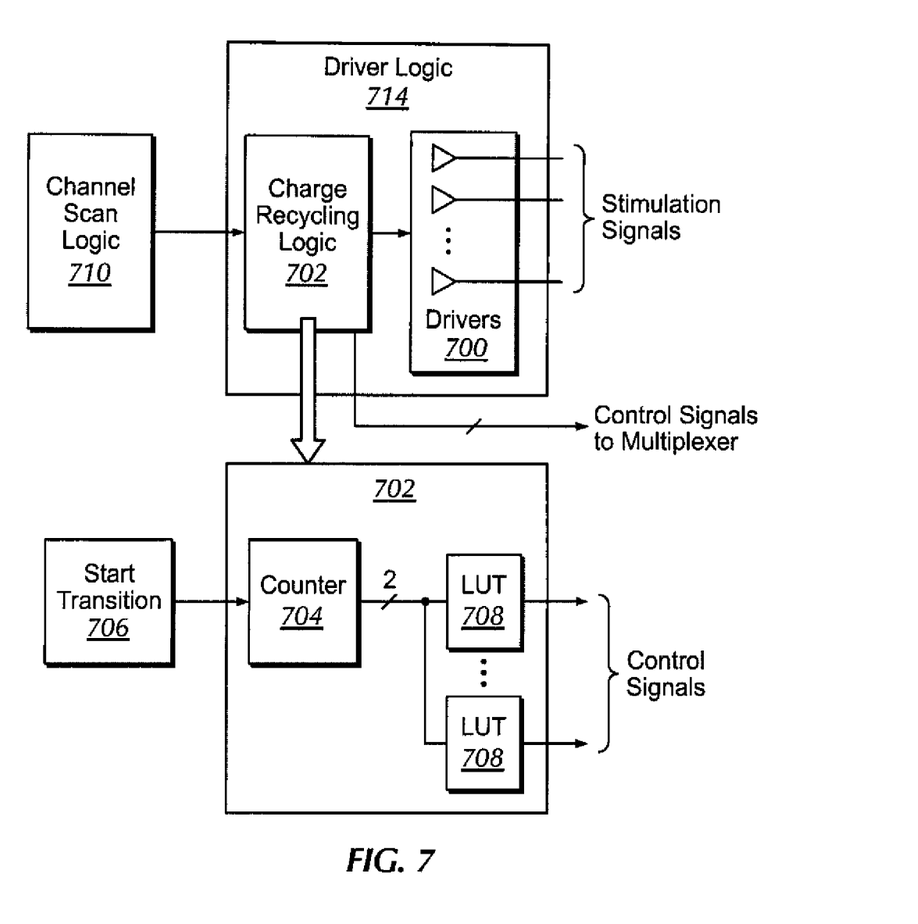
FIG. 7 illustrates exemplary channel scan logic and driver logic implementing charge recycling according to one embodiment of this invention.

FIG. 7 illustrates exemplary channel scan logic 710 and driver logic 714 implementing charge recycling according to embodiments of the invention. In the example of FIG. 7, channel scan logic 710 controls driver logic 714 to configure drivers 700 to apply certain stimulation signals or voltage levels to certain drive lines. Additionally, charge recycling logic 702 in driver logic 714 can configure the multiplexers to perform charge recycling. Charge recycling logic 702 can receive start transition signal 706, which can start counter 704, which can step through various states to access one or more look-up tables (LUTs) 708 to generate the proper control signals for the multiplexers depending on the stimulation patterns being applied.

Figure 8A:
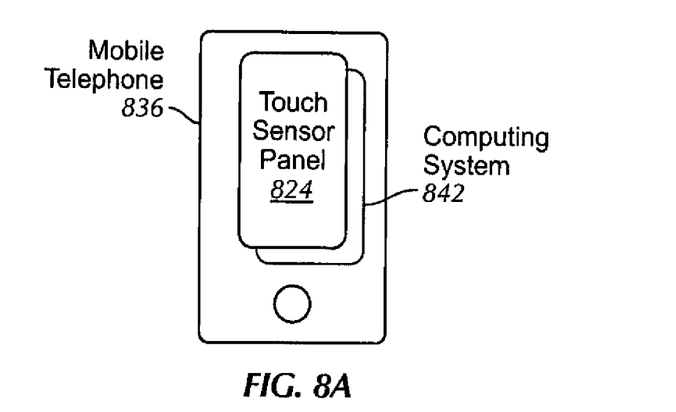
FIG. 8a illustrates an exemplary mobile telephone utilizing charge recycling according to one embodiment of this invention.

FIG. 8a illustrates exemplary mobile telephone 836 that can include touch sensor panel 824 and computing system 842 for implementing the charge recycling described above according to embodiments of the invention.

Figure 8B:
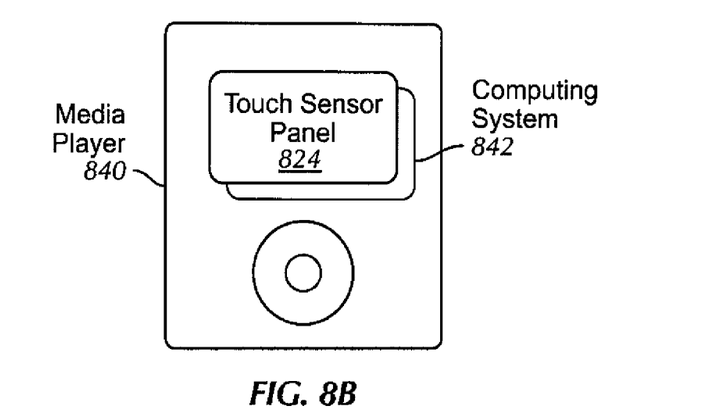
FIG. 8b illustrates an exemplary digital media player utilizing charge recycling according to one embodiment of this invention.

FIG. 8b illustrates exemplary digital media player 840 that can include touch sensor panel 824 and computing system 842 for implementing the charge recycling described above according to embodiments of the invention.

Figure 8C:
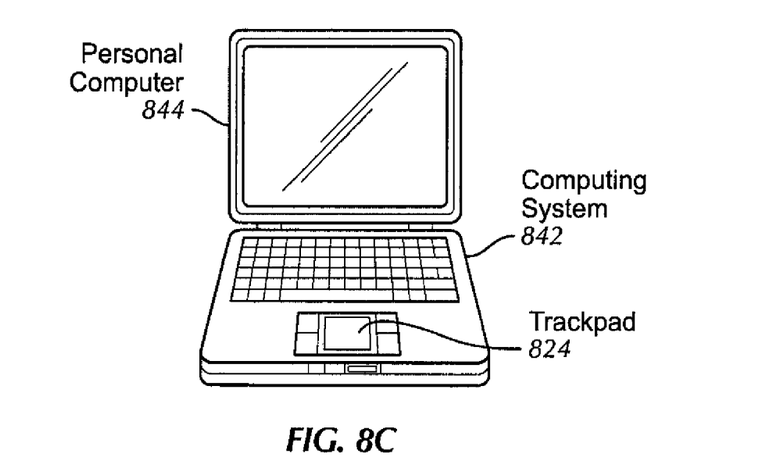
FIG. 8c illustrates an exemplary personal computer including a touch sensor panel (trackpad) and utilizing charge recycling according to one embodiment of this invention.

FIG. 8c illustrates exemplary personal computer 844 that can include touch sensor panel (trackpad) 824 and computing system 842 for implementing the charge recycling described above according to embodiments of the invention. The mobile telephone, media player, and personal computer of FIGS. 8a, 8b and 8c can advantageously benefit from the charge recycling described above because implementation of these features can minimize battery drain when being operated from battery power.

Although embodiments of this invention have been fully described with reference to the accompanying drawings, it is to be noted that various changes and modifications will become apparent to those skilled in the art. Such changes and modifications are to be understood as being included within the scope of embodiments of this invention as defined by the appended claims.

What is claimed is:

1. An apparatus for recycling charge during stimulation of a touch sensor panel, comprising:
   a plurality of drivers coupled to a first group of one or more drive lines of the touch sensor panel and a second group of one or more drive lines of the touch sensor panel, the plurality of drivers configured for simultaneously driving the first and second groups with stimulation signals;
   a plurality of first multiplexers coupled to the first and second groups and configurable for providing a first charge recycling path for the first and second groups, the first charge recycling path for recycling charge stored in capacitances on the drive lines of the first and second groups.

2. The apparatus of claim 1, the plurality of drivers further configured for simultaneously driving the first and second groups with stimulation signals of opposite polarity, and the plurality of first multiplexers further configurable for providing the first charge recycling path between the first and second groups for recycling charge between the first and second groups.

3. The apparatus of claim 2, further comprising control logic coupled to the plurality of multiplexers for configuring the multiplexers to partially discharge a first capacitance formed at the first group through the first charge recycling path while simultaneously partially charging a second capacitance formed at the second group.

4. The apparatus of claim 3, further comprising:
   a charge recycling switch coupled between each driver and a holding capacitor; and
   a ground switch coupled between each driver and ground;
   wherein the control logic is further coupled to the charge recycling switches and ground switches for configuring both sets of switches to recycle charge into the holding capacitor when a capacitance formed at an output of the driver is discharged through the driver.

5. The apparatus of claim 3, the control logic comprising a charge recycling modulation block for configuring the multiplexers using a pulse width modulated (PWM) control signal to regulate the discharging of the first capacitance and the charging of the second capacitance.

6. The apparatus of claim 2, the plurality of first multiplexers further configurable for providing a second charge recycling path between a third group of one or more drive lines and a fourth group of one or more drive lines, the second charge recycling path for recycling charge between the third and fourth groups.

7. The apparatus of claim 2, further comprising a touch sensor panel including the first and second groups of one or more drive lines, and wherein the plurality of drivers, the plurality of multiplexers, and the touch sensor panel are incorporated within a computing system.

8. The apparatus of claim 7, wherein the computing system is incorporated within a mobile telephone.

9. The apparatus of claim 7, wherein the computing system is incorporated within a media player.

10. The apparatus of claim 7, wherein the computing system is incorporated within a personal computer.

11. The apparatus of claim 1, the plurality of drivers further configured for simultaneously driving the first and second groups with stimulation signals of a same frequency and phase, and the plurality of first multiplexers further configurable for providing the first charge recycling path from the first and second groups to a holding capacitor.

12. The apparatus of claim 11, further comprising control logic coupled to the plurality of multiplexers for configuring the multiplexers to partially discharge the charge stored in the capacitances on the drive lines of the first and second groups through the first charge recycling path and into the holding capacitor, and for configuring the multiplexers to partially charge the capacitances on the drive lines of the first and second groups through the first charge recycling path with charge stored in the holding capacitor.

13. The apparatus of claim 1, further comprising control logic coupled to the plurality of multiplexers for selectively configuring the multiplexers to recycle the charge stored in the capacitances on the drive lines of the first and second groups according to whether a regular panel scan or an auto-scan is to be performed.

14. A method for recycling charge during stimulation of a touch sensor panel, comprising:
   simultaneously driving a first group of one or more drive lines of the touch sensor panel and a second group of one or more drive lines of the touch sensor panel with stimulation signals;
   providing a first charge recycling path for the first and second groups, the first charge recycling path for recycling charge stored in capacitances on the drive lines of the first and second groups.

15. The method of claim 14, further comprising simultaneously driving the first and second groups with stimulation signals of opposite polarity, and providing the first charge recycling path between the first and second groups for recycling charge between the first and second groups.

16. The method of claim 15, further comprising partially discharging a first capacitance formed at the first group through the first charge recycling path while simultaneously partially charging a second capacitance formed at the second group by transferring charge from the first capacitance to the second capacitance.

17. The method of claim 16, further comprising discharging the first capacitance and charging the second capacitance by configuring a driver logic connected to the first group to provide a discharge path to a holding capacitor to recycle charge into the holding capacitor.

18. The method of claim 16, further comprising using a pulse width modulated (PWM) control signal to regulate the discharging of the first capacitance and the charging of the second capacitance.

19. The method of claim 15, further comprising providing a second charge recycling path between a third group of one or more drive lines and a fourth group of one or more drive lines, the second charge recycling path for recycling charge between the third and fourth groups.

20. The method of claim 19, further comprising partially discharging a third capacitance formed at the third group through the second charge recycling path while simultaneously partially charging a fourth capacitance formed at the fourth group by transferring charge from the third capacitance to the fourth capacitance.

21. The method of claim 14, further comprising simultaneously driving the first and second groups with stimulation signals of a same frequency and phase, and providing a first discharge path from the first and second groups to a holding capacitor.

22. The method of claim 21, further comprising partially discharging the charge stored in the capacitances on the drive lines of the first and second groups through the first charge recycling path and into the holding capacitor, and partially charging the capacitances on the drive lines of the first and second groups through the first charge recycling path with charge stored in the holding capacitor.

23. The method of claim 14, further comprising selectively recycling the charge stored in the capacitances on the drive lines of the first and second groups according to whether a regular panel scan or an auto-scan is to be performed.

24. A digital media player including an apparatus for recycling charge during stimulation of a touch sensor panel, the apparatus comprising:
- a plurality of drivers coupled to a first group of one or more drive lines of the touch sensor panel and a second group of one or more drive lines of the touch sensor panel, the plurality of drivers configured for simultaneously driving the first and second groups with stimulation signals; and
- a plurality of first multiplexers coupled to the first and second groups and configurable for providing a first charge recycling path for the first and second groups, the first charge recycling path for recycling charge stored in capacitances on the drive lines of the first and second groups.

25. A personal computer including an apparatus for recycling charge during stimulation of a touch sensor panel, the apparatus comprising:
- a plurality of drivers coupled to a first group of one or more drive lines of the touch sensor panel and a second group of one or more drive lines of the touch sensor panel, the plurality of drivers configured for simultaneously driving the first and second groups with stimulation signals; and
- a plurality of first multiplexers coupled to the first and second groups and configurable for providing a first charge recycling path for the first and second groups, the first charge recycling path for recycling charge stored in capacitances on the drive lines of the first and second groups.

* * * * *